(12) United States Patent
Cairo et al.

(10) Patent No.: US 7,696,893 B2
(45) Date of Patent: Apr. 13, 2010

(54) APPARATUS AND RELATED METHOD FOR SENSING CRACKS IN ROTATING ENGINE BLADES

(75) Inventors: Ronald Ralph Cairo, Greer, SC (US); Jianqiang Chen, Greenville, SC (US)

(73) Assignee: General Electric Company, Schenectady, NY (US)

( * ) Notice: Subject to any disclaimer, the term of this patent is extended or adjusted under 35 U.S.C. 154(b) by 299 days.

(21) Appl. No.: 11/905,901

(22) Filed: Oct. 5, 2007

(65) Prior Publication Data
US 2009/0092491 A1    Apr. 9, 2009

(51) Int. Cl.
*G08B 21/00* (2006.01)
(52) U.S. Cl. .................. 340/680; 340/679; 340/945
(58) Field of Classification Search .......... 340/679, 340/680, 945; 416/230
See application file for complete search history.

(56) References Cited

U.S. PATENT DOCUMENTS

| | | | | |
|---|---|---|---|---|
| 4,026,660 A | * | 5/1977 | Ueda et al. | 416/61 |
| 4,757,717 A | * | 7/1988 | Wolfinger et al. | 73/660 |
| 6,543,992 B2 | * | 4/2003 | Webster | 415/10 |
| 6,756,908 B2 | * | 6/2004 | Gass et al. | 340/679 |
| 7,023,205 B1 | * | 4/2006 | Krupp | 324/239 |
| 7,424,823 B2 | * | 9/2008 | Teolis et al. | 73/112.01 |
| 7,582,359 B2 | * | 9/2009 | Sabol et al. | 428/469 |

* cited by examiner

*Primary Examiner*—Benjamin C Lee
*Assistant Examiner*—Andrew Bee
(74) *Attorney, Agent, or Firm*—Nixon & Vanderhye P.C.

(57) ABSTRACT

A method and apparatus for detecting structural anomalies in the body of rotating members of an engine involves establishing an electric circuit in the body of the rotating members by embedding a network of electrically conductive fibers. Upon rotation of the members in the presence of a magnetic field, an electric current flows in the electrically conductive fibers of the rotating members. Detection of a structural anomaly in any of the rotating members results from detecting a break of the electric circuit.

18 Claims, 2 Drawing Sheets

APPARATUS AND RELATED METHOD FOR SENSING CRACKS IN ROTATING ENGINE BLADES

BACKGROUND OF THE INVENTION

Rotating components in large machines such as gas turbines, steam turbines, or aircraft engines, operate under large centrifugal stresses and may suffer breaks or cracks located at various points in the body of the rotating component. For example, engines have rotating compressor units that move and compress air. The compressor has blades around the periphery of a rotating disk, and the high speeds that the blades rotate induce high levels of stresses that tend to pull the components apart and cause cracks. In addition, through problems of excessive wear, the rotating assembly components may become unbalanced, which imposes unacceptable loads on the unit, possibly resulting in the creation of cracks. Once a crack is formed, it may grow in size until the rotating component is separated from the main assembly, thus resulting in a catastrophic failure. The problem is of gravest importance with passenger-carrying jet airliner engines, where upon such failure, separated blade components penetrate the engine compartment and/or the aircraft itself, thus impairing the air worthiness of the aircraft.

The most common method of detecting anomalies, such as cracks, in a rotating component of an engine, is to electronically monitor vibrations emanating from the rotating component. The idea is that a rotating assembly that lacks any cracks or similar imperfections is optimally balanced during the manufacturing and testing process, therefore vibrations due to asymmetrical rotational forces are minimal. Monitoring of dangerously high vibration amplitudes, or at least, large incremental changes over otherwise normal patterns of vibration, provides a good indication of a break or excessive wear present anywhere in the rotating unit.

Sonnichsen and Milatovic (U.S. Pat. No. 6,456,945) discloses a method of detecting cracks in a rotor, by measuring the rotational speed and vibration of the rotor. A processor subtracts a baseline vibration signal from the detected vibration measurement to produce a vibration difference signal. Subsequently, the amplitude and the phase of the vibration difference signal is measured to determine if anomaly, such as a crack, has occurred. Similarly, Gasch and Mingfu (U.S. Pat. No. 5,533,400), discloses a method for sensing cracks formed in rotating shafts, wherein the harmonic vibration components of flexural vibrations of the shaft are measured.

The vibration sensing method even though it offers the advantage of real time detection of anomalies in the body of the rotating unit, lacks sensitivity to the exact or even the approximate location of the crack. Since the method is based on sensing the vibration caused by unbalance during the operation of the unit, and said unbalance is created by the presence of cracks anywhere in the body of the unit, which produce an aggregate result, the method can not be tailored to sense small individual cracks in high-risk areas, such as the tip of the blade. Furthermore, the vibration sensing method is relatively complex, as it requires several peripheral electronic components, such as filters, speed sensors, etc.

In addition to the above real time monitoring of the occurrence of cracks in rotating units in engines, manual inspection may also be performed. More specifically, the engine is taken apart and the unit under inspection is immersed in a fluorescent solution. The fluorescent material will penetrate any cracks in the area and make them visible under ultraviolet light. Manual inspections are costly and time consuming, since the engine must be taken out of service and be disassembled.

BRIEF DESCRIPTION OF THE INVENTION

Described herein is an apparatus and a method for detecting the occurrence of structural anomalies, such as cracks, in rotating compressor blades of an engine during operation of the rotating unit. The detection system can be used with great sensitivity both in terms of the magnitude of the crack as well as its location within the rotating part. Furthermore, the system can be used during testing of the rotating unit or during actual operation.

In one embodiment, the detection apparatus includes a network of carbon fibers embedded in the body of the rotating blade. The fibers are connected and are in the proximity of a magnetic member. An electric circuit is established in the carbon fiber network, when the blade rotates. Upon the occurrence of a crack anywhere along the carbon fiber circuit, the fibers separate and break the electric circuit. This, in turn, creates a detection signal.

In another embodiment, a method for detecting structural anomalies in the body of rotating members of an engine includes establishing a network of embedded electrically conductive fibers in the members, positioning a magnetic member relative to the rotating members, detecting a break in the electric circuit created along the embedded fibers due to the presence of the magnetic member, the break in the electric circuit being caused by the occurrence of a structural anomaly in the body of a rotating member and generating warning signals upon detection of the break in the electric circuit.

DETAILED DESCRIPTION OF THE INVENTION

Figure 1:
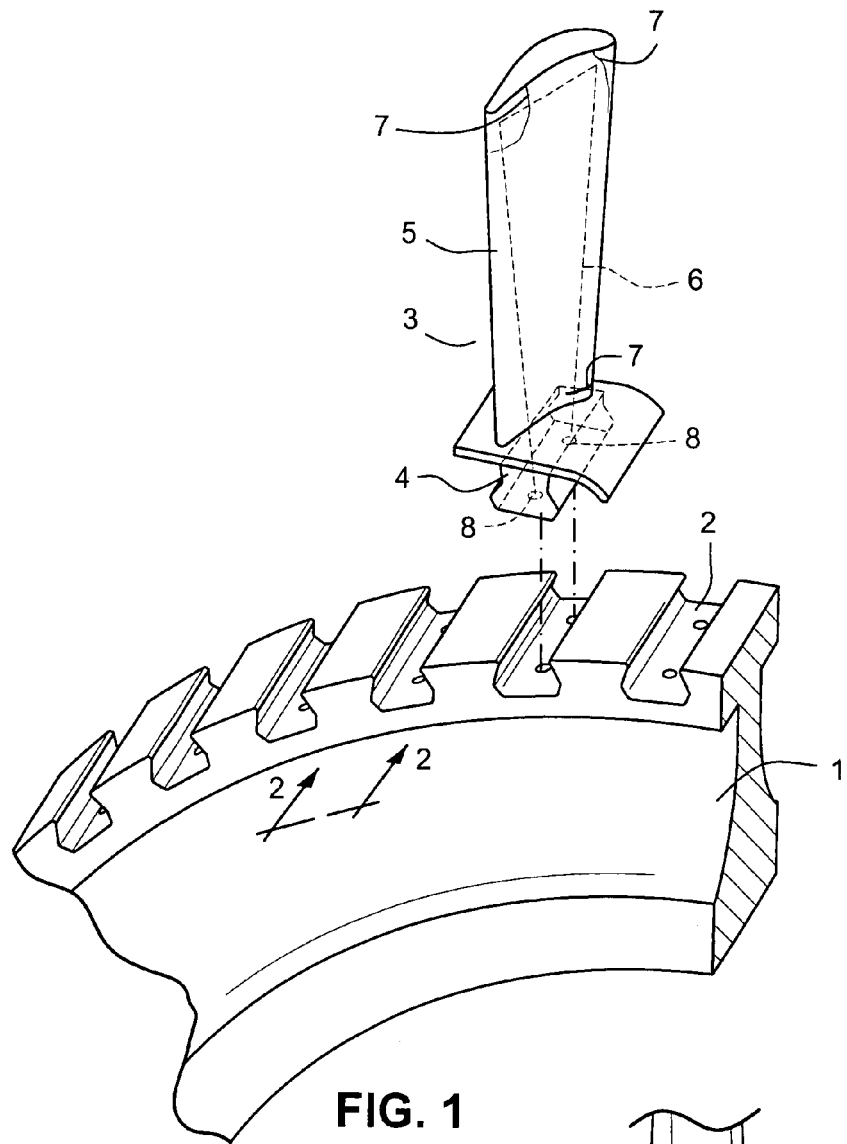
FIG. 1 is a schematic diagram of a crack-detection system according to one embodiment of the invention, showing one of the blades.

FIG. 1 shows an exemplary embodiment incorporating carbon fibers for the detection of cracks formed in rotating blades. The system includes a rotating disk 1, which may be part of a rotating element, such as a compressor of an engine, including, one of a gas turbine, a steam turbine or an aircraft turbine. Along the circumference of the disk 1, there are radial grooves 2 machined or formed at the blade attachment slots, i.e., locations corresponding to the locations of the blades 3. A single blade 3 is shown in FIG. 1. It comprises a dovetail 4 that conforms in size and shape with the size and shape of the groove 2, and an airfoil 5, which constitutes the main body of the blade 3. The shape of part 5 is typically polygonal and depends on the specific type of the engine.

A pre-impregnated carbon tow 6, the tow comprising a bundle of individual carbon filaments impregnated with a polymer resin and subjected to partial curing, is inlaid into a trough machined or formed into the airfoil at critical stress location(s), i.e., areas where cracks 7 are likely to initiate.

Referring to FIG. 1, such areas include, the tips of the blade, the leading edge of the blade, and the dovetail of the blade. The prepreg (pre-impregnated with matrix) carbon fibers are co-cured (bonded) to the airfoil using non-conductive matrix and/or a non-conductive adhesive at the chosen areas. The fiber volume of the inlaid prepreg carbon tow material is less then 30%, so that the whole sensing component is uncoupled from the response of the blade itself, in other words, it behaves as an electrical component rather than a part of the structural medium. Preferably, the matrix material is an epoxy, but it can also be a polymer. The carbon fibers are commercially available and are chosen based on their strength relative to the airfoil material. Preferably, they have low strain-to-failure relative to other ductile airfoil materials. In addition, carbon fibers have a high modulus, and are much stronger and typically stiffer that the metallic materials of compressor blades, hence must be used in low fiber volumes when they are in the composite tow form.

Figure 2:
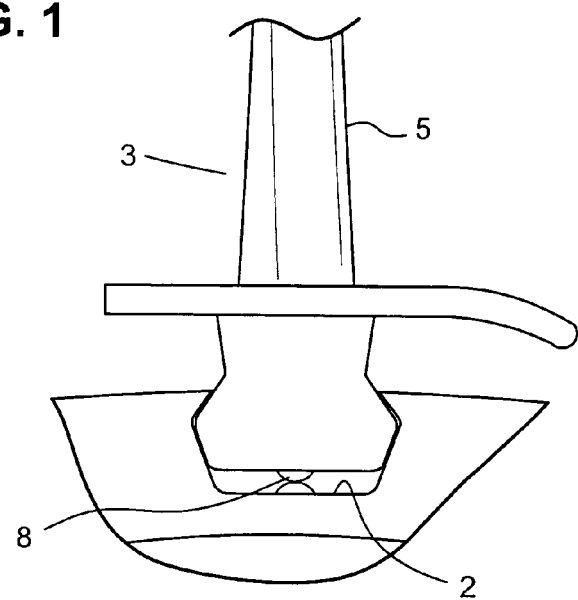
FIG. 2 is an enlarged view of a portion of the crack-detection system of FIG. 1.

As shown in FIG. 1, each blade element includes a carbon fiber tow 6 that is inlaid around the periphery of the blade. Connecting points 8 in the groove 2 provide electrical contact between the circuit located in the blade 3 and the part of the circuit located in the disk 1. An expanded view of the connection area between a blade and the disk is shown in FIG. 2.

Figure 3:
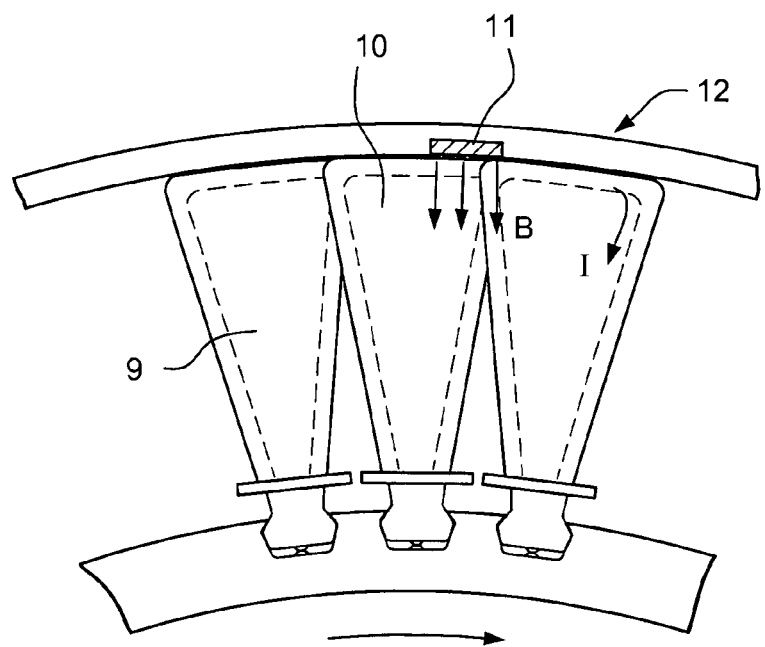
FIG. 3 is a schematic diagram of a crack-detection system according to another embodiment of the invention showing the creation of an electric circuit established in the rotating blades.

In a further embodiment, carbon fibers tows are embedded in other blade elements of the disk in a similar way as described above. Subsequently, the various carbon fiber inlays from all the blades are connected in series to form a circuit. This can be seen in FIG. 3, where two adjacent blades 9 and 10, with their embedded carbon fiber tow networks, are shown. At least one magnet 11 is then assembled on the compressor casing 12 and axially aligned with the mid-chord of the blade. This arrangement will generate an electric current, I, in the carbon fiber circuit when the blades rotate under the influence of magnetic field B. If a crack occurs anywhere within the area of the blades and propagates through the locations where the carbon fibers are tightly bonded to the airfoil, then the strain energy that is released due to the crack will cause the low strain-to-failure fibers to fail (separate) and break the (series) electric circuit. This, in turn, creates a response signal that provides a feed signal to an audible alarm or a visual alarm for the plant operator, or the aircraft pilot.

Figure 4:
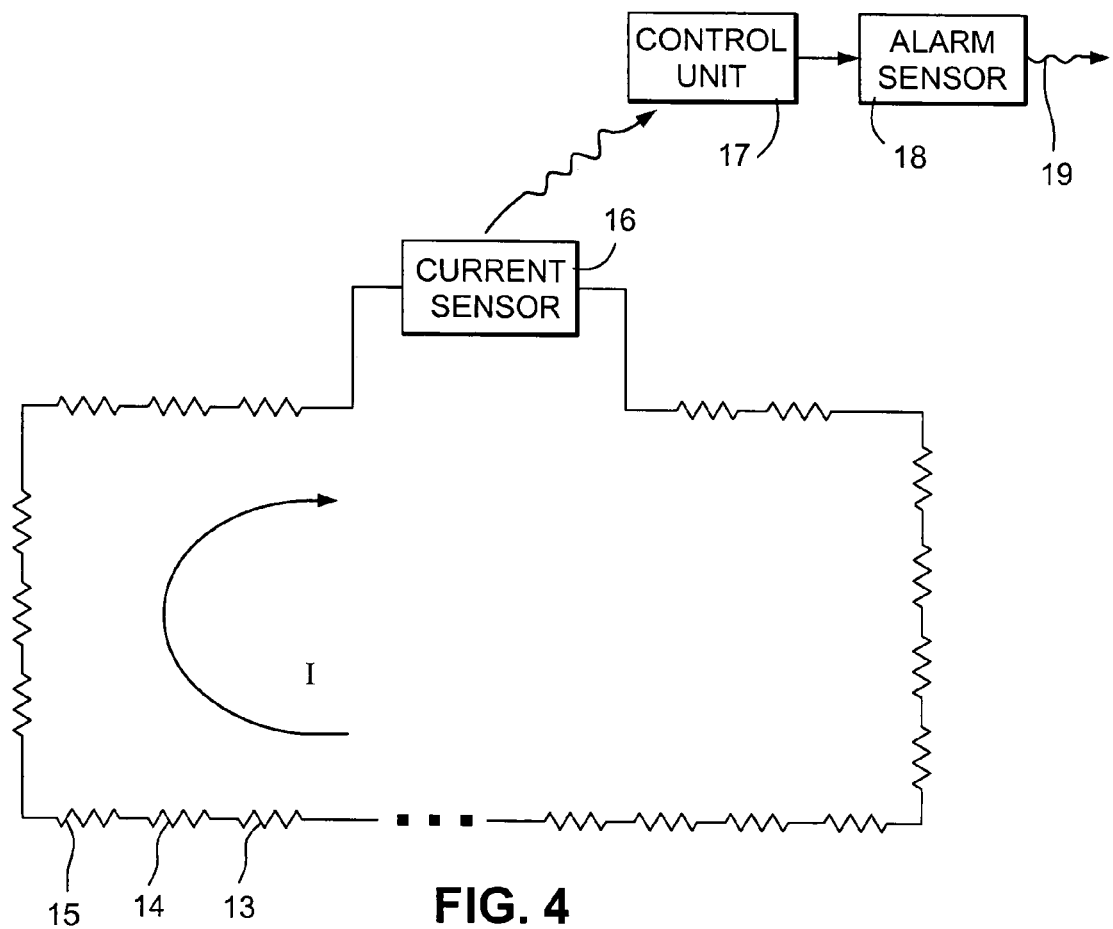
FIG. 4 is a schematic diagram showing the detection stage of the crack-sensor.

FIG. 4 is a schematic of the detection stage of the crack-sensor. The carbon fibers embedded in the airfoil of each of the blades are connected in series, so that when a current is generated due to rotation in the presence of the magnetic field, the series circuit of FIG. 4 is created. Each fiber inlay in a blade is represented by a resistance (only three 13, 14, and 15 are labeled in FIG. 4). A current sensor 16 is connected in series with the fiber inlays. In a preferred embodiment, there is a current sensor dedicated to each rotating disk/stage. Typically, there are 10 to 12 stages in a land-based power generating gas turbine unit. The current sensor, which can be any state-of-the art commercially available current sensor, is located away from the disk, electrically connected to it, in a stationary station. When a crack anywhere in the blades of a stage occurs that causes a break in the circuit, then the current sensor transmits a signal to one or more of control units 17, through either hard-wired or wireless (radio frequency, infrared, etc.) circuitry. The control unit, typically located within 100 to 300 feet from the current sensors, usually has a separate channel or zone for an alarm sensor 18. The alarm sensor produces an appropriate output signal 19, when the crack-sensor senses a crack that triggers (fractures carbon composite tow-wire) the system. The alarm output signal can be used to create an audible tone (high frequency, typically around 3.2 KHz, at a high volume-around 85 dB at appropriate distance), or a visible signal such as a strobe light with at least 110 candela output, or a combination of the two.

The crack detection capability of the disclosed system can be tailored to the specific type of compressor used, since the carbon fiber inlays can be designed to correspond only to the high-risk areas of the blade. For example, if the compressor is used in applications where cracks at the tips of the blades are most common, then the carbon fibers are embedded in such a way so that they include the high-risk areas around the tips. This is an advantage over the vibration sensing method, which is insensitive to the exact location of the crack within the body of the rotating blade.

The detection system described herein is used for detecting cracks in compressor blades before they grow in critical size and cause blade separation. Furthermore, the embedded carbon fibers are very light and they are uncoupled from the response of the blade itself. In addition, the fiber selection is tailored to the fiber's strain capability so that the response does not become hyper-sensitive, resulting in false alarms.

The written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for detecting cracks or structural breaks in the body of rotating compressor blades of an engine, comprising:
   a) embedding electrically conductive carbon fibers in the body of said blades;
   b) connecting in series the fibers embedded in all the said blades;
   c) embedding at least one magnet at a position along the periphery of a casing enclosing said blades for generating a magnetic field;
   d) creating an electric circuit along the embedded network of carbon fibers when the blades are rotating under the influence of the magnetic field;
   e) detecting a break in said electric circuit caused by the occurrence of a crack or a structural break at a location in one of said blades.

2. The method according to claim 1, wherein said engine is any one of a gas turbine, steam turbine, or aircraft engine.

3. The method according to claim 1, wherein a) comprises impregnating the carbon fibers with a matrix material.

4. The method according to claim 3, wherein the matrix material comprises any one of epoxy or polymer.

5. The method according to claim 1, wherein a) comprises embedding the carbon fibers along the periphery of each rotating blade into a trough in the body of each blade.

6. The method according to claim 3, wherein the carbon fibers are bonded to the blades using non-conductive matrix and/or a non-conductive adhesive.

7. The method according to claim 3, wherein the fiber volume of the embedded carbon material is less than about 30%.

8. The method of claim 1, wherein c) comprises aligning the at least one magnet with the mid-chord of a blade.

9. The method of claim 1, wherein detection of a crack or a structural break results in the creation of a signal that provides an alarm to an operator.

10. An apparatus for detecting cracks or structural breaks formed in the body of rotating compressor blades of an engine, comprising:
- a network of electrically conductive carbon fibers embedded in the body of said blades;
- at least one magnet embedded at a position along the periphery of a casing enclosing said blades;
- detection means for detecting a break in the electric circuit comprising the network of the electrically conductive carbon fibers, wherein the electric circuit is established when said blades rotate under the influence of a magnetic field from the magnet, said break in the electric circuit caused by a crack or a structural break at a location in one of said blades.

11. The apparatus according to claim 10, wherein said engine is any one of a turbine, steam turbine, or aircraft engine.

12. The apparatus according to claim 10, wherein the carbon fibers are impregnated with a matrix material.

13. The apparatus according to claim 12 wherein the matrix material comprises one of epoxy or polymer.

14. The apparatus according to claim 10, wherein the carbon fibers are embedded along the periphery of each rotating blade into a trough in the body of each blade.

15. The apparatus according to claim 12, wherein the carbon fibers are bonded to the blades using non-conductive matrix and/or a non-conductive adhesive.

16. The apparatus according to claim 12, wherein the fiber volume of the embedded carbon material is less than about 30%.

17. The apparatus according to claim 10, wherein the at least one magnet is aligned with the mid-chord of a blade.

18. The apparatus of claim 10, further comprising means for the generation of a signal that provides an alarm to an operator.

* * * * *